United States Patent
Lin

(10) Patent No.: US 10,185,609 B2
(45) Date of Patent: Jan. 22, 2019

(54) VIRTUAL TIMER FOR DATA RETENTION

(71) Applicant: SMART Modular Technologies, Inc., Newark, CA (US)

(72) Inventor: Shu-Cheng Lin, Taipei (TW)

(73) Assignee: SMART Modular Technologies, Inc., Newark, CA (US)

( * ) Notice: Subject to any disclaimer, the term of this patent is extended or adjusted under 35 U.S.C. 154(b) by 0 days.

(21) Appl. No.: 15/388,704

(22) Filed: Dec. 22, 2016

(65) Prior Publication Data

US 2018/0181454 A1 Jun. 28, 2018

(51) Int. Cl.
*G06F 11/07* (2006.01)
*G06F 3/06* (2006.01)
(Continued)

(52) U.S. Cl.
CPC ............ *G06F 11/073* (2013.01); *G06F 3/064* (2013.01); *G06F 3/0619* (2013.01); *G06F 3/0653* (2013.01); *G06F 3/0659* (2013.01); *G06F 3/0673* (2013.01); *G06F 11/076* (2013.01); *G06F 11/0793* (2013.01); *G11C 16/34* (2013.01); *G11C 29/52* (2013.01); *G06F 11/1068* (2013.01); *G11C 29/42* (2013.01); *G11C 29/50016* (2013.01); *G11C 2029/0409* (2013.01); *G11C 2029/0411* (2013.01); *G11C 2029/5002* (2013.01)

(58) Field of Classification Search
CPC ............... G06F 11/073; G06F 11/1068; G06F 11/1451; G06F 11/1456; G06F 11/1461; G06F 3/0619; G06F 3/064; G06F 3/0659; G06F 3/0679; G11C 29/42; G11C 29/52

See application file for complete search history.

(56) References Cited

U.S. PATENT DOCUMENTS 8,560,922 B2   10/2013   Bivens et al.
2012/0124273 A1   5/2012   Goss et al.
(Continued)

FOREIGN PATENT DOCUMENTS

EP         2494554 B1    12/2015
WO    2014116394 A1     7/2014

OTHER PUBLICATIONS

Cai et al., Data retention in MLC NAND Flash memory: Characterization, Optimization, and Recovery, IEEE, pp. 551 to 563. (Year: 2015).*

(Continued)

*Primary Examiner* — Shelly A Chase
(74) *Attorney, Agent, or Firm* — Wong & Rees LLP; Kirk D. Wong

(57) ABSTRACT

Approaches, techniques, and mechanisms are disclosed for improving data retention using a virtual timer. A memory controller may use a raw bit error rate (RBER) to find an equivalent temperature-accelerated data age of a data item. The data age is computed by using the initial RBER of virtual timing data (VTD) as a virtual write in time of the data item compared to a present time using the current RBER of the VTD. When the data age is determined to exceed a data retention threshold, a data refresh is performed on the data item at the memory block on the memory device. The data age may be stored as virtual timing data on the memory block.

22 Claims, 6 Drawing Sheets

(51) Int. Cl.
*G11C 29/52* (2006.01)
*G11C 16/34* (2006.01)
*G06F 11/10* (2006.01)
*G11C 29/42* (2006.01)
*G11C 29/50* (2006.01)
*G11C 29/04* (2006.01)

(56) References Cited

U.S. PATENT DOCUMENTS

| | | | | |
|---|---|---|---|---|
| 2013/0159603 | A1* | 6/2013 | Whitney | G06F 12/0246 |
| | | | | 711/103 |
| 2013/0326284 | A1* | 12/2013 | Losh | G06F 11/2053 |
| | | | | 714/47.2 |
| 2014/0059405 | A1* | 2/2014 | Syu | G11C 16/349 |
| | | | | 714/773 |
| 2016/0070474 | A1 | 3/2016 | Yu et al. | |
| 2016/0110249 | A1* | 4/2016 | Orme | G06F 3/0619 |
| | | | | 714/6.24 |
| 2017/0185472 | A1* | 6/2017 | Kathawala | G06F 11/0727 |

OTHER PUBLICATIONS

World Intellectual Property Organization, Application No. PCT/US17/64972, International Search Report dated Mar. 20, 2018.
World Intellectual Property Organization, Application No. PCT/US17/64972, Pending Claims as of Mar. 20, 2018.

* cited by examiner

US 10,185,609 B2

VIRTUAL TIMER FOR DATA RETENTION

TECHNICAL FIELD

Embodiments relate generally to a computing system, and, more specifically, to techniques for data retention and solid state drive (SSD) reliability.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Electronics and electronic computing systems are continually developed with greater computing performance for a given space and within a given power profile. Additionally, as more and more functionality moves to the cloud, scalability within a short time frame becomes increasingly important. Within the systems, the integrated circuit and memory modules are building blocks used to power cloud-supported and other applications for front-end and back-end usage in products such as automotive vehicles, computers, cell phone, intelligent portable military devices, aeronautical spacecraft payloads, and a vast line of other similar products supporting many complex functions.

Products compete in world markets and attract many consumers or buyers in order to be successful. It is important for products to continue to improve in features, performance, and reliability while reducing product costs and product size, while still being available quickly for purchase by the consumers or buyers. Additionally, it is important for the computing systems using SSDs to optimally refresh data stored in memory modules for data retention purposes, decreasing the likelihood of data loss. With higher data retention, less time is required to retrieve data and perform calculations, ultimately reducing the time an end-user waits for a response.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
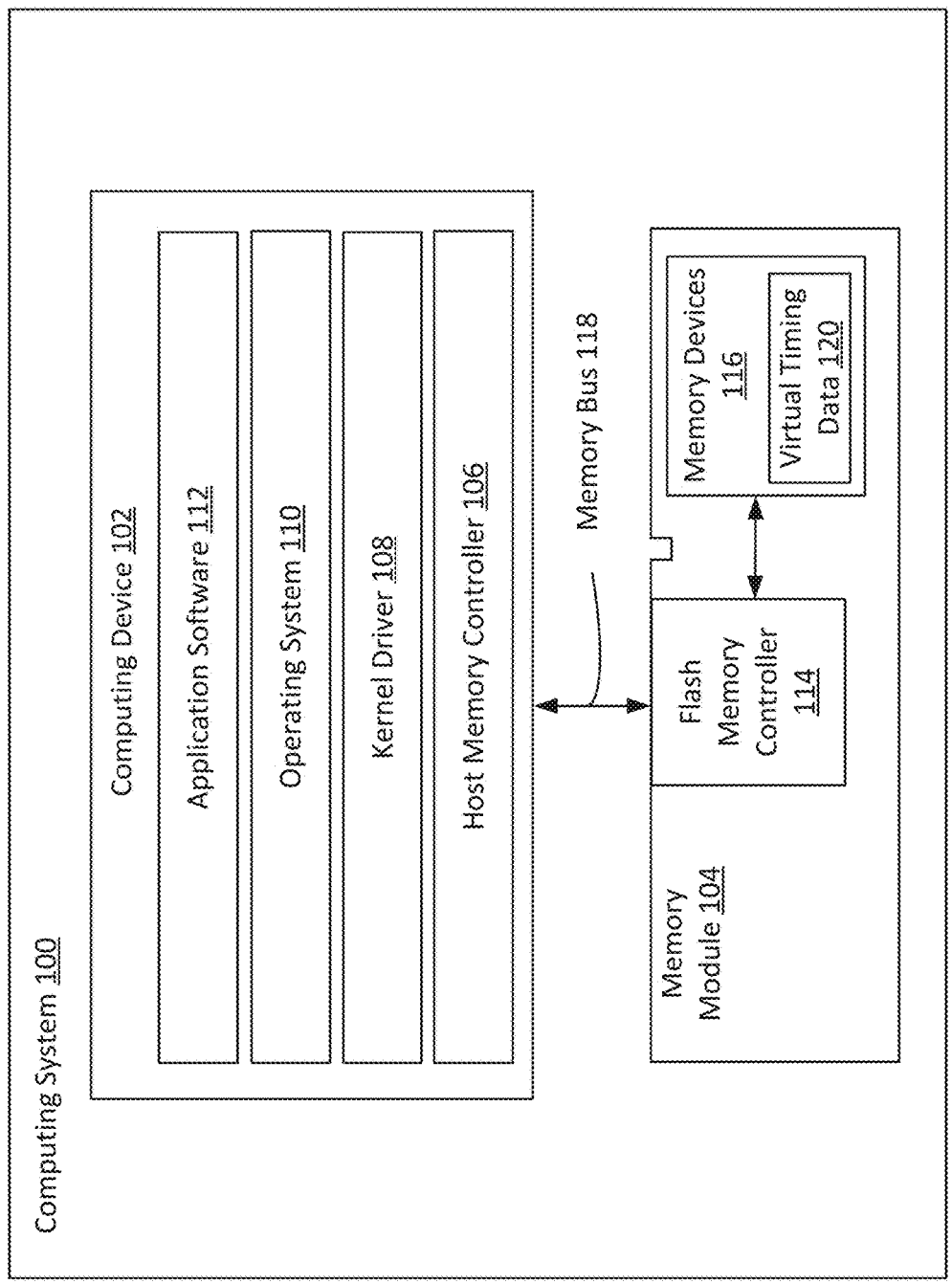
FIG. 1 is an illustrative view of an example computing system, according to an embodiment.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:

1.0. General Overview
2.0. System Overview
3.0. Functional Overview
   3.1. Modelling Data Retention time Thresholds
   3.2. Implementing a Virtual Timer
   3.3. Virtual Timer using SLC Memory Blocks
   3.4. Example Process Flow Utilizing a Virtual Timer
4.0. Example Embodiments
5.0. Extensions and Alternatives 1.0. General Overview Approaches, techniques, and mechanisms are disclosed for improving the reliability of solid state drives, or solid-state disks, (SSDs). A "solid state disk drive" (SSD) is defined as a type of device that uses non-volatile memories. An SSD may include a system having a memory controller that interfaces with a memory device to store or retrieve information. SSD drives primarily use electronic interfaces compatible with traditional input/output (I/O) hard disk drives (HDD), however new I/O interfaces have been introduced to address specific requirements of SSD technology. SSDs have no moving mechanical components and use NAND-based flash memory, a type of non-volatile memory that retains data when power is lost. Data persistence, reliability and performance of an SSD system depend on data retention policies that use various functions and methods of refreshing data stored on the SSD system, however, suitable trigger conditions are needed to implement the data retention policies effectively.

While lower priced drives usually use multi-level cell (MLC) flash memory, these drives are slower and less reliable than single-level cell (SLC) flash memory. Data retention policies may rely on a data age of a block of data, recorded in a table, such that once the data age crosses a data retention time threshold, expressed as an amount of time upon which the associated data "expires" in one embodiment, the corresponding block of data is refreshed to reduce data errors and/or avoid data loss. However, refreshing data involves rewriting the data, and NAND flash memory typically has a limited number of program/erase (P/E) cycles. A "program/erase cycle" (P/E cycle) is defined as a base level operation of how data is replaced within an erase block. An erase block is defined as a group of pages, which is the smallest number of pages that are erased at one time. A "page" is defined as a memory component within an erase block that is programmed as an individual unit; the page is a smallest group of data bytes that are read from or written to in an erase block. A threshold voltage (Vth) is defined as a voltage setting applied to internal comparators of a memory device including NAND, which determine digital values stored in the memory device's cells. A bit error rate (BER) referred to herein is defined as a number of incorrect bits in a data stream stored in a memory device including NAND; the BER can typically be detected within a code word protected by error correction code (ECC). An error correction code (ECC) is defined as parity data generated over a set of data grouped into a code word. A code word is defined as a group of data bytes covered by a single of multiple ECC parity words.

As a result, data refresh should be performed when needed. Yet the data age recorded in the table, when compared to a system clock, may be inaccurate due to power outages affecting the system clock. "Real time measurements" is defined as data collected from hardware, software, or a combination thereof. The real time measurements represent current states of operation and characteristics of a drive. Further, the data age of page(s) and/or block(s) of data may be accelerated by the temperature of the SSD system due to stresses on the cells of the flash memory. Whereas, the data age of blocks of data could be much more optimally recorded if a more accurate timing device could be used that incorporates an estimate of the temperature acceleration effect on the data age.

According to an embodiment, a data refresh is triggered before data becomes unreliable, or in other words, when the data age exceeds a data retention time threshold. The data retention time threshold can be defined based on device endurance and a data retention characterization result for a specific temperature, usually the average application temperature. The data age of each data in the device may be recorded as a data write-in time table by a timer. In this manner, the data is refreshed before the data age exceeds the data retention time threshold, thereby allowing the memory devices to be utilized with more reliable data (e.g., less data retention errors) than would be possible conventionally. For example, a data retention time threshold may be two weeks for a particular type of memory device. However, the data age may be affected by various factors because a high number of reads on a memory block may increase the likelihood of data loss. Similarly, high temperatures may accelerate the data age of a memory block.

According to an embodiment, when an SSD receives a request to store data persistently at the SSD that includes a memory module, a memory controller of the SSD computes a raw bit error rate (RBER) of a memory block within the memory module. Through various computations and calculations, as described herein, the RBER of a memory block, which may be calculated using functionality inherent in the memory controller, may be used to estimate the effect of temperature-based acceleration of data age. In this way, a temperature profile of the SSD is not needed to calculate the temperature-based acceleration of the data age. Instead, virtual timer data (VTD) may be stored on a single-level cell (SLC) block on the memory module, and the memory controller may perform a scan of the SLC block that stores to the VTD to compute a RBER that is used in determining the data age of the associated data in the memory module. As such, an estimated data age, taking into account age acceleration caused by temperature, is determined and/or monitored or updated periodically. Once the estimated data age exceeds the data retention time threshold, the associated data item stored on the associated memory block may be refreshed to ensure data retention.

According to an embodiment, VTD may experience a high number of read operations, causing read issues with respect to the VTD and the NAND SLC block. Periodic maintenance of the VTD, VTD specific criteria for data refresh, preparing more area for VTD backup (e.g., over-provisioning for the VTD), or a specified RBER threshold for VTD may be implemented to overcome the potential read issues. As a result, the VTD may have increased data reliability.

2.0. System Overview

FIG. 1 is an illustrative view of various aspects of an example computing system 100 in which the techniques described herein may be practiced, according to an embodiment. The illustrative view depicts an example of a system block diagram of computing system 100. Computing system 100 can represent, without limitation, personal computers (PCs), desktop computers, laptops, notebooks, workstations, servers, diskless workstations and thin clients, hybrid computers, mainframes, supercomputers, microcomputers, nanocomputers, "smart" home appliances, consumer electronics, display devices, entertainment systems, etc. Computing system 100 includes a memory module 104 interfacing with a computing device 102.

Computing device 102 includes any combination of hardware and software, configured to implement various logical components. For example, computing device 102 may include one or more memories storing instructions for implementing the various components, one or more hardware processors configured to execute the instructions stored in the one or more memories, and various data repositories in the one or more memories for storing data structures utilized and manipulated by the various components. For illustrative purposes, only one computing device 102 is shown, although it is understood that computing system 100 can include any number of computing devices 102 that can be configured to connect and communicate with each other.

Computing device 102 includes hardware components, such as a host memory controller 106. Host memory controller 106 is configured to communicate with memory module 104 to store data into memory module 104 or retrieve data from memory module 104. Computing device 102 may further include software components, such as a kernel driver 108, an operating system 110, and application software 112.

Kernel driver 108 operates as an interface between operating system 110 and host memory controller 106. Kernel driver 108 executes in a kernel mode on an underlying hardware. Kernel driver 108 manages a memory and how the memory is paged using for example, a paged pool, non-paged pool, etc. Kernel driver 108 may operate with low level hardware bits, such as interrupts and interrupt request levels (IRQLs).

Operating system 110 is a set of software that manages hardware and software resources, and provides common services for various application software 112. Operating system 110 may be a component of system software in computing system 100. Application software 112 is a set of executable software code that is written for and installed to run under operating system 110.

Memory module 104 includes a flash memory controller 114 and memory devices 116. Flash memory controller 114 interfaces with host memory controller 106 and memory devices 116. Flash memory controller 114 interfaces with host memory controller 106 via a memory bus 118. Flash memory controller 114 receives requests from host memory controller 106 for access to memory devices 116 to write data to memory devices 116 or read data from memory devices 116.

Flash memory controller 114 may interface with a variety of types of memory devices 116 using a variety of different protocols. In an embodiment, flash memory controller 114 may include a virtual timer as programmed in one or more modules in firmware that records an expiration time associated with data stored in the memory devices 116 received from host memory controller 106 to manage data retention on memory devices 116. Flash memory controller 114 may be customized or specifically designed to have functionality that existing memory controllers do not have, such as estimating the effect of temperature acceleration on data age on memory devices 116. Virtual timing data 120 may be stored on memory devices 116 as a result of customized or specifically designed functionality of the flash memory controller 114. In an embodiment, memory devices 116 may be used as a cache memory for computing device 102 to store information for host memory controller 106, kernel driver 108, operating system 110, application software 112, or any other component of computing device 102. In other embodiments, memory devices 116 may be used as long term storage, such as a solid state drive (SSD), such that the host memory controller 106 relies on the flash memory controller 106 for data retention.

Examples of memory devices 116 may include, without limitation, memory integrated circuits (ICs), volatile memory, non-volatile memory, heat-assisted magnetic recording and patterned media, and so forth. Memory devices 116 may include, without limitation, random-access memory (RAM), dynamic RAM (DRAM), Flash, crossbar memory, embedded Multi-Media Controller (eMMC), resistive RAM (RRAM), phase-change RAM (PRAM), magnetoresistive RAM (MRAM), ferroelectric RAM (F-RAM or FeRAM), Millipede memory, nano-RAM, silicon-oxide-nitride-oxide-silicon (SONOS), conductive-bridging RAM (CBRAM), molecular memory, double data rate (DDR) synchronous dynamic random-access memory (SDRAM), DDR type two (DDR2) SDRAM, DDR type three (DDR3) SDRAM, DDR type four (DDR4) SDRAM, NOR Flash, vertical NAND (V-NAND) memory, NAND Flash, floating-gate transistors, single-level cell (SLC) devices, triple-level cell (TLC) devices, multi-level cell (MLC) devices, or combinations thereof.

In an embodiment, flash memory controller 114 is implemented using a block access protocol. The block access protocol may include a mechanism for accessing data using a contiguous block of consecutive locations or addresses in a memory device 116. For example, flash memory controller 114 may access a predefined number of bytes or words that are stored in consecutive addresses of memory devices 116.

Computing system 100 is but one example of a system in which the techniques described herein may be practiced. Other systems in which the techniques described herein may be practiced may comprise fewer or additional elements in varying arrangements.

3.0. Functional Overview 3.1. Modelling Data Retention Time Thresholds

Figure 2A:
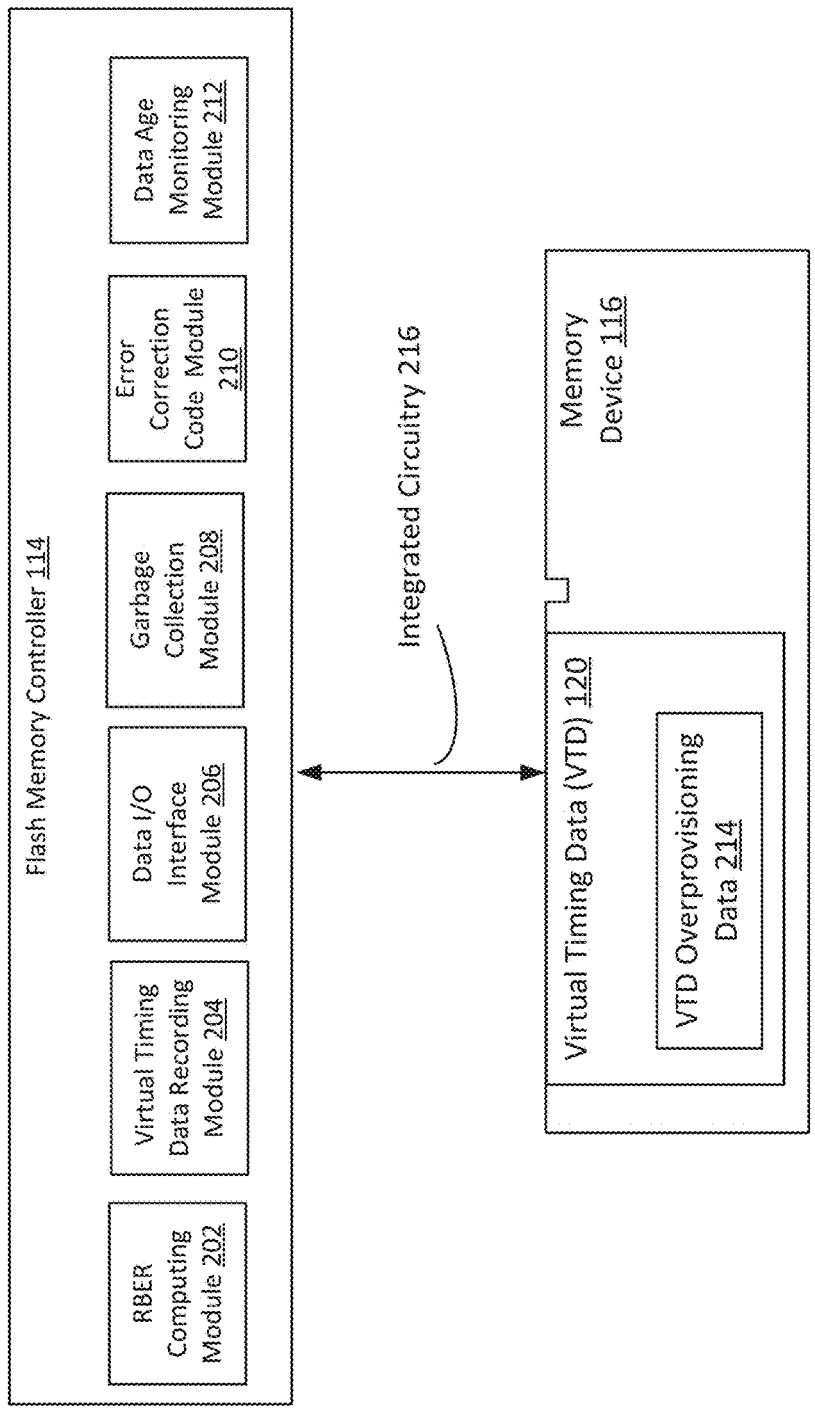
FIG. 2A is an illustrative view of a high level block diagram of an example flash memory controller and an example memory device communicating over integrated circuitry, according to an embodiment.

FIG. 2A is a high level block diagram of an example flash memory controller 114 communicating various instructions to an example memory device 116 over integrated circuitry 216, according to an embodiment. FIG. 2A is only one example of a manner in which a flash memory controller 114 may be programmed to include modules that create a virtual timer for data retention purposes in accordance with the described techniques. In other embodiments, a virtual timer may use process flows and/or functional blocks that include fewer or additional elements, with different timings and/or arrangements. The example depicts a process in which the flash memory controller 114 sends one or more instructions to a memory device 116 to store virtual timing data (VTD) 120, which may include VTD overprovisioning data 214. Flash memory controller 114 may receive information from the memory device 116 indicating various information, such as a raw bit error rate (RBER), successful program (write) of data on the memory device 116, and so forth.

Flash memory controller 114 may include one or more modules, such as a RBER computing module 202, a virtual timing data recording module 204, a data input/output (IO) interface module 206, a garbage collection module 208, an error code correction module 210, and a data age monitoring module 212. For example, flash memory controller 114 may issue a command to write data on a memory device 116 that triggers additional data to be written and captured on the memory device 116, such as VTD 120 and VTD overprovisioning data 214.

To avoid data retention errors, a data refresh can be triggered before data becomes unreliable, e.g., when the data's age exceeds a data retention time threshold. A data retention time threshold can be defined based on a device's endurance and data retention (EDR) characterization result for a specific temperature, usually the average application temperature. The data age of each data in the device may be recorded as a data write-in time table by a timer. Periodically, the table can be checked to refresh the data when the data age meets the data retention time threshold.

However, the system temperature can affect the data age because data retention follows the Arrhenius model for temperature acceleration. When the system temperature has much variation, the equivalent temperature acceleration data age for the average application temperature may already exceed the data retention time threshold, even if the data age as recorded by a system clock (or actual timer) remains below the threshold. For example, let $t_{eq.app}$ represent the equivalent temperature acceleration data age for average application temperature, let t represent a time period at the actual temperature, then $t_{eq}$=t*AF, where AF is an acceleration factor for $T_{actual}$ to $T_{app}$. The following equation applies the Arrhenius model for temperature acceleration:

$$AF=\exp[(-Ea/k)*(1/T_{actual}-1/T_{app})] \quad \text{(Equation 1)}$$

In the equation above, $Ta_{pp}$ represents the average application temperature (in degrees Kelvin), $T_{actual}$ represents the actual temperature (in degrees Kelvin), Ea represents the activation energy for detrapping, and k represents Boltzmann's constant. An example data time threshold reveals that, according to the EDR characterization result for an average 55 C application, when a data written to a NAND flash block on 15:00 Jul. 11, 2016, this write-in time is recorded. If this block has suffered 1000 P/E cycles, the data should be refreshed after 3 weeks, i.e., on 15:00 Aug. 1, 2016.

However, an actual temperature profile of an appliance may reveal various variations in temperature over time for the system, such as being at 55 C for a first week, 70 C for a second week, and 55 C for the third week. Let Ea represent the activation energy for detrapping, so assume 1.1 eV. An equivalent data age $$t_{eq}=t*AF \quad \text{(Equation 2)},$$

such that:
=t1*AF(55 C to 55 C)+t2*AF(70 C to 55 C)+t3*AF(55 C to 55 C)
=(1 week)*exp[(−Ea/k)*(1/328K−1/328K)]+(1 week)*exp[(−Ea/k)*(1/343K−1/328K)]+(1 week)*exp[(−Ea/k)*(1/328K−1/328K)]
=7.48 weeks For this temperature profile, the real time period is 3 weeks, but $t_{eq.app}$, 7.48 weeks, already exceeds the 3 week data retention time threshold. As a result, to monitor the $t_{eq.app}$, the device may need to record not only the time period of a data item, but also the temperature profile. Furthermore, if the system power is not always on, the time record may be inaccurate because the system's timer may be turned off (in power-off mode). Additionally, monitoring the temperature of the system requires temperature sensors that require additional logic and may be more expensive to maintain. A virtual timer that need not be always powered on that can represent $t_{eq.app}$, as accelerated by temperature, is needed.

Through various methods and experimentation, and using characterization results for several NAND flash memory devices, a relationship between the raw bit error rate (RBER) and data retention time has been found to follow the power-law model, as expressed by the following equation:

$$RBER = RBER_0 + A*t_{charc}^B \quad \text{(Equation 3)}$$

"RBER" represents the raw bit error rate read at average application temperature. "$RBER_0$" represents the raw bit error rate read at the beginning of the retention period. "A" represents an arbitrary scale factor, dependent upon materials and process details, while "B" represents a retention-time power law coefficient. "$t_{charac}$" represents the data retention time at characterization stress temperature. According to various characterization results, $RBER_0$ is almost zero, thus, the equation may be simplified as:

$$RBER = A*t_{charac}^B \quad \text{(Equation 4)}$$

Figure 2B:
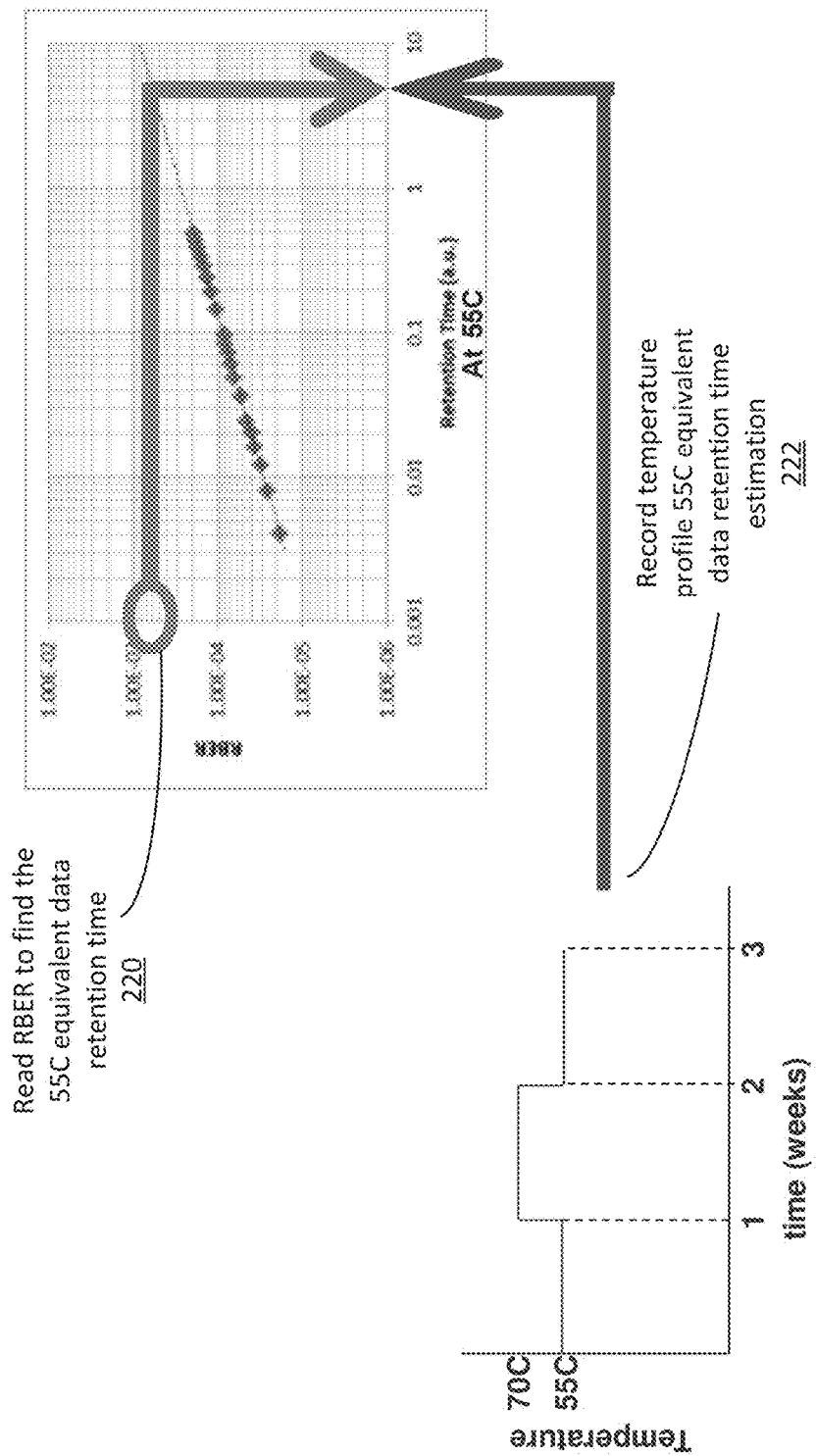
FIG. 2B is an illustrative view of example screenshots of determining a data age using a virtual timer, according to an embodiment.

In various characterization tests, data was written into NAND flash and then put in a specific temperature environment for long periods of time. The RBER was checked at several time points during the characterization tests. For example, FIG. 2B illustrates an example plot of RBER at various time points. By illustrating the RBER versus time on a plot, the trendline fit the power-law equation very well.

Because data retention, and more specifically, a time to failure, has been found to follow the Arrhenius model for temperature acceleration of failure mechanisms, the temperature acceleration equivalent time for different temperatures may be estimated to reach the same data retention status, e.g., RBER. As a result, RBER versus data retention at test temperature may translate to RBER versus data retention at average application temperature. In other words, RBER can directly relate to $t_{eq.app}$, as shown in the following equations:

$$t_{eq.app} = t_{charac} * AF$$

$$AF(\text{acceleration factor for } T_{charac} \text{ to } T_{app}) = \exp[(-Ea/k)*(1/T_{charac} - 1/T_{app})]$$

$$RBER = A*t_{charac}^B = A*(t_{eq}/AF)^B = A*(1/AF)^B * t_{eq}^B$$

Referring back to FIG. 2A, a RBER computing module 202 of the flash memory controller 114 may be used to compute the RBER of a block of memory. In one embodiment, computing the RBER is an available functional component of flash memory controllers. Calculating the RBER, or the raw bit error rate, may be performed based on a number of raw bit errors that occur during a read of a memory block. A virtual timing data recording module 204 may store the write-in time of a data item that is written to a memory device 116. The virtual timing data recording module 204 may periodically update the data age of the associated data item based on the RBER computed in accordance with the methods described above.

A data I/O interface module 206 may include a flash translation layer, in one embodiment, that maps a traditional block addressing scheme to the flash memory device 116. The flash memory controller 114 may use a data I/O interface module 206 that accompanies the memory device 116, in an embodiment. Similarly, a garbage collection module 208, a standard function of a flash memory controller 114, may determine when a memory block is no longer being used on the memory device 116 and an error correction code module 210 may provide additional data, redundant data, such that errors can be detected and/or corrected when data is read. Error correction code functionality may be a standard functionality of the flash memory controller 114. For illustrative purposes, module data may use a 64-bit bus along integrated circuitry 216, although it is understood that module data may include any number of bits. For example, module data may include 72 bits, with 64 bits of data and 8 bits of error correction code (ECC).

A data age monitoring module 212 may periodically monitor, or may be triggered upon a read of data items stored on the memory device 116, the data age of data items as recorded by the virtual timing data recording module 204. The data age monitoring module 212 may read the VTD 120 stored on the memory device 116 to determine whether the data age of a data item exceeds a data retention time threshold, in one embodiment. VTD overprovisioning data 214 may be used by the data age monitoring module 212 to ensure that the VTD 120 is accurately stored on the memory device 116.

3.2. Implementing a Virtual Timer

FIG. 2B illustrates example screenshots of using RBER to determine a data age using a virtual timer. FIG. 2B is only one example of a manner in which a virtual timer may record a data age in accordance with the described techniques. In other embodiments, virtual timers may be implemented using process flows that include fewer or additional elements, with different computations and/or arrangements.

Referring to FIG. 2A, a virtual timing data recording module 204 may store the write-in time of a data item that is written to a memory device 116. The virtual timing data recording module 204 may periodically update the data age of the associated data item based on the RBER computed in accordance with the methods described above. Flash memory controller 114 may read 220 RBER to find the 55 C equivalent data retention time. As described above, a temperature profile of the system need not be recorded to estimate $t_{eq.app}$, but instead the RBER may be used to find $t_{eq.app}$. As another example, assume the average application temperature is 55 C. FIG. 2B illustrates two data charts, showing RBER versus data retention time at 55 C. Extrapolating the characterization results for RBER versus data retention at 125 C and following the Arrhenius model for temperature acceleration to translate the result to RBER versus data retention at 55 C, the RBER may be measured to find $t_{eq.app}$. Specifically, a flash memory controller 114, as illustrated in FIG. 2A, may scan a memory block and read 220 RBER to find the 55 C equivalent data retention time. Alternatively, a temperature sensor may be used to record 222 temperature profile 55 C equivalent data retention time estimation, as described above. However, the computational complexity and cost of adding a temperature sensor, in comparison to scanning the RBER of a memory block, is much higher and/or expensive.

Using the data characterizations plotted in the chart in FIG. 2B, as well as other characterizations not illustrated, the RBER may be used to identify an equivalent data retention time. For example, virtual timing data (VTD) may be written during device initialization (i.e., before user application) to act as an existing timer. During user application, when the memory device wants to record the time of when the user data is written in, the device will read the VTD and use the VTD's RBER to find a $t_{eq.app}$ as the present time, where the data age may be calculated as the present time minus the data write in time. Thus, a temperature profile is not needed.

The virtual timing data recording module 204 may periodically calculate the data age of the associated data item based on the RBER computed. The data age may be recorded daily, weekly, monthly, or based on any configurable time period, in one embodiment. In another embodiment, the data age may be calculated upon a transaction event for the associated data item, such as when the data item is read or edited (rewritten).

Figure 3:
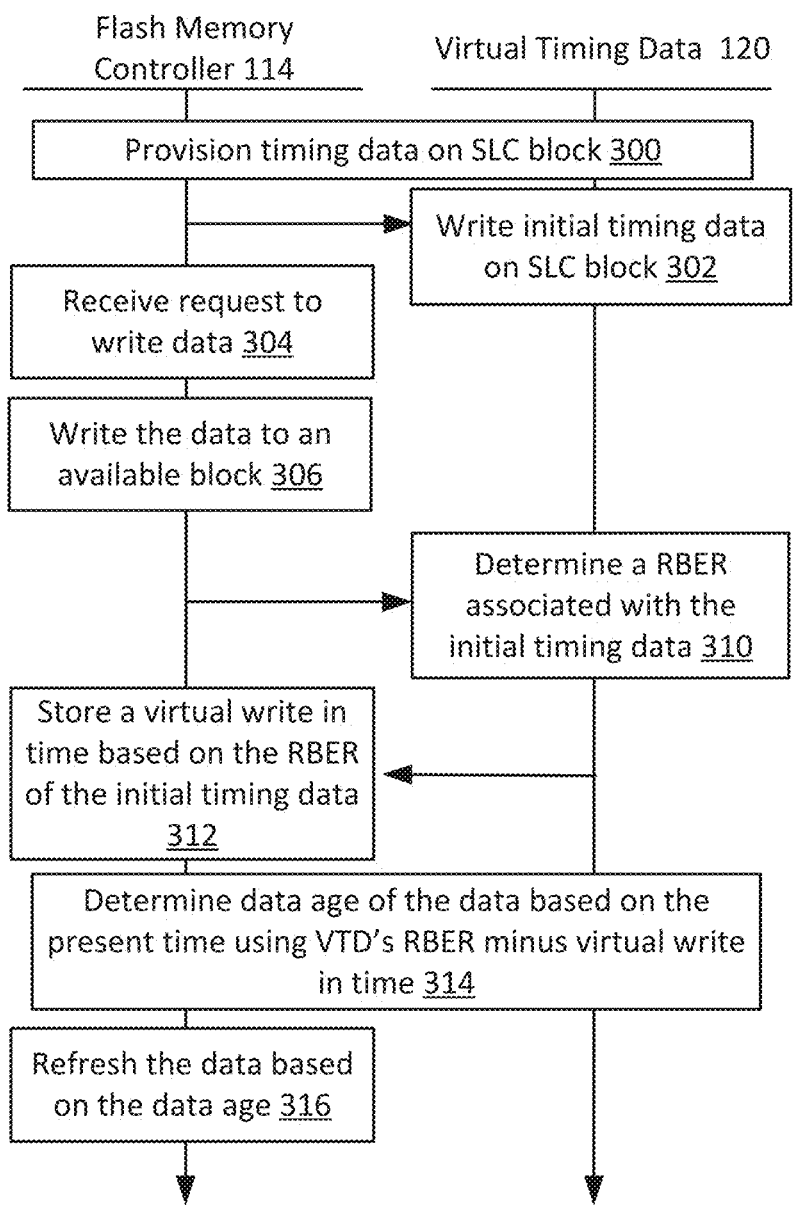
FIG. 3 is an example interaction diagram between a flash memory controller and virtual timing data, according to an embodiment.

FIG. 3 illustrates an example interaction diagram between a flash memory controller 114 and virtual timing data (VTD) 120. FIG. 3 is only one example of a manner in which a virtual timer may record a data age in accordance with the described techniques. In other embodiments, virtual timers may be implemented using process flows that include fewer or additional elements, with different computations and/or arrangements.

Timing data may be provisioned 300 on a single level cell (SLC) block on the memory device 116. A single level cell (SLC) block is used because of the greater data reliability of the SLC block, as opposed to a multi-level cell (MLC) block. The flash memory controller 114 may initialize the VTD 120 by writing 302 initial timing data on the SLC block 302. A request may be received 304 by the flash memory controller 114 to write data to the memory device 116. The flash memory controller 114 may write 306 the data to an available block 306. A RBER associated with the initial timing data may be determined 310, in one embodiment. A virtual write in time may be stored 312 based on the RBER of the initial timing data. The data age of the data may be determined 314 based on the present time using the VTD's RBER minus the virtual write in time. Then, the data may be refreshed 316 based on the data age in comparison to a data retention time threshold.

FIG. 3 represents a flash memory controller 114 and virtual timing data 120 stored on the same memory device 116. The aging mechanism (charge detrap) and factors (time and temperature) of VTD and user data are the same, so the virtual timer can represent a more accurate data age because VTD and user data are in the same environment. Because multiple memory devices 116 may be used in an SSD, and due to the variation of NAND flash quality for each device, having a virtual timer which utilizes a NAND flash block of the same device can provide more suitable time values that fit each device's quality. While NAND flash memory is described here, other types of non-volatile memory, such as phase change memory and resistive random-access memory, may be used instead of flash memory in alternative embodiments.

3.3. Virtual Timer Using SLC Memory Blocks

Figure 4:
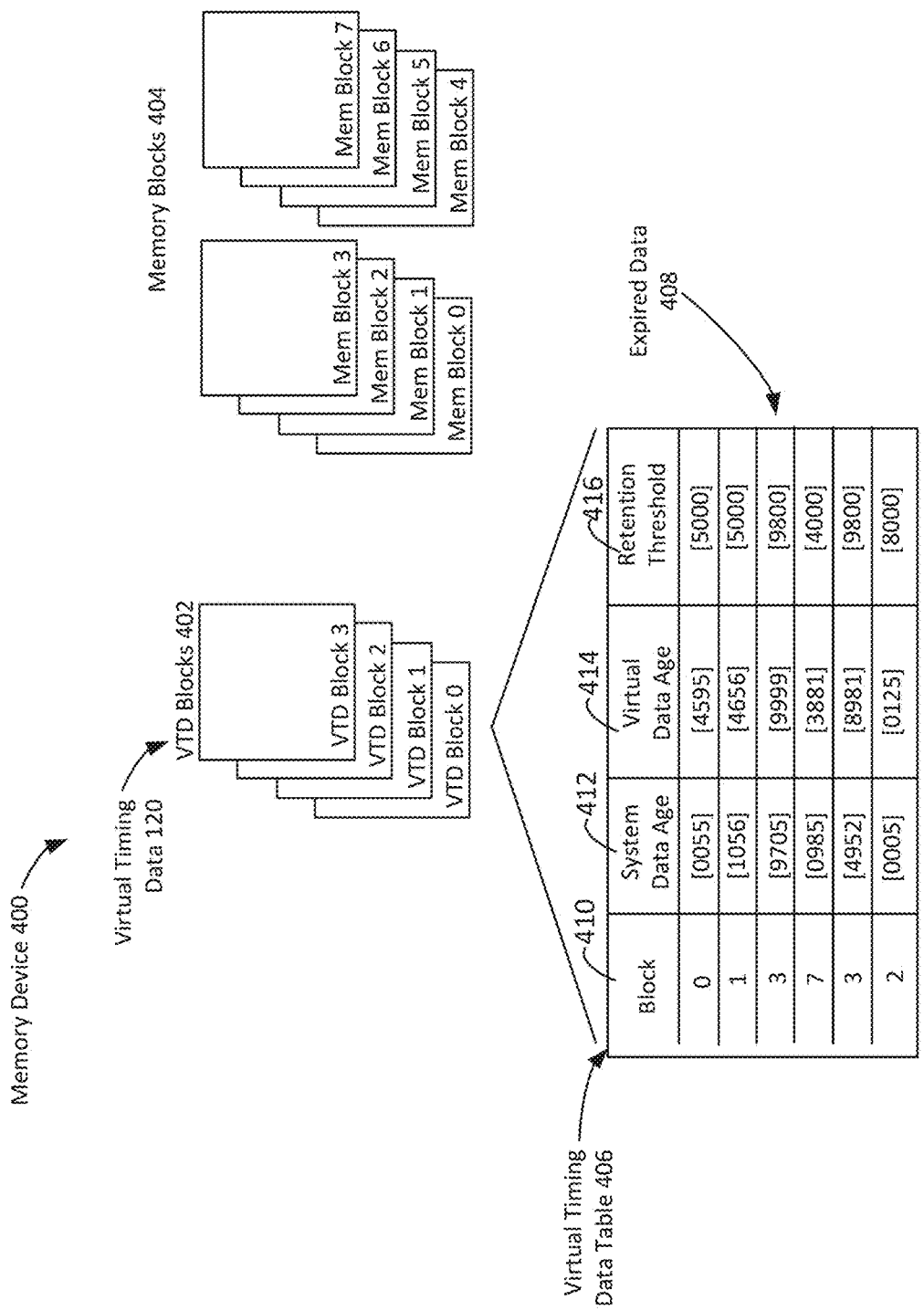
FIG. 4 is an example diagram of a memory device, according to an embodiment.

FIG. 4 is an example diagram of a memory device 400, according to an embodiment. The diagram depicts an example of a structure or geometry of memory device 400. For example, the diagram depicts a logical device structure of a NAND flash memory. Of course, similar structures or geometries may be applied to other types of memories. Also, for example, memory device 400 may be memory device 116.

Memory device 400 includes VTD blocks 402 and memory blocks 404. For illustrative purposes, the diagram depicts memory device 400 as having 4 VTD blocks 402 and 8 memory blocks 404, although memory device 400 may in fact have any number of VTD blocks and memory blocks. Virtual timing data 120 may be stored on VTD blocks 402, and a separate virtual timing data table 406 may be stored on each VTD block 402. The first column 410 of the virtual timing data table 406 may represent a block identifier associated with the memory block storing user data, or the data being written to the memory device 400. The second column 412 of the virtual timing data table 406 may include a system data age as measured by a system clock. Here, a four-digit data age is illustrated, but any number of digits may be used to record a data age of a data item. In other embodiments, a data write in time may be stored instead of a data age. A third column 414 of the virtual timing data table 406 may represent a virtual data age as determined by one or more processes or modules of a flash memory controller 114, as described above. A fourth column 416 of the virtual timing data table 406 may represent a retention threshold, or a specific data retention time threshold associated with a data item. The virtual timing data table 406 may be stored as a table, list, matrix, or other type of data structure. The table 406 depicted in FIG. 4 is merely one example of a virtual timing data table used in accordance with the described techniques for ease of illustration. In other embodiments, virtual timing data tables may be implemented using include fewer or additional elements, with different columns and/or arrangements. For example, instead of a virtual data age column 414, a virtual data write in time may be substituted where the virtual data age is computed on based on a transactional event.

As an example, the third row of the virtual timing data table 406 illustrated in FIG. 4 reveals that, for a data item stored in block 3, the virtual data age computed by the flash memory controller 114, as illustrated in FIG. 2A, has reported a virtual data age of "9999" which exceeds the retention threshold for that block, which is "9800." Here, the unit of time may be in hours, but any unit of time may be used, including, but not limited to, minutes, seconds, days, months, or years. As a result, this row of data may be marked or identified, in an embodiment, as expired data 408 requiring a data refresh according to a data retention policy. As shown in the virtual timing data table 406, different retention thresholds may exist for different blocks of data, according to an embodiment. In other embodiments, a same retention threshold is used as a matter of memory management policy. In one embodiment, a different memory threshold may be used for a particular memory block based on the frequency of usage of the memory block. In another embodiment, similar types of memory blocks may have similar retention thresholds. In yet further embodiments, the retention threshold of a memory block may vary based on the type and quality of memory device, as described above. Varying types of memory devices may use different materials that are more reliable in data retention. Such factors may affect a retention threshold. In another embodiment, a retention threshold may be calculated based on past data retention performance. In a further embodiment, the number of P/E cycles may affect the retention threshold calculation. One or more factors may be used in determining a retention threshold calculation.

The example data in the virtual timing data table 406 further illustrates a row in which, at block 3, data has been written that has a system data age of "4952" according to a system clock and a virtual data age of "8951" as determined by the flash memory controller 114. This data may be the refreshed data of the same data that was previously associated with the third row of the VTD table 406, in one embodiment. In another embodiment, the expired data 408 that was triggered to be refreshed, or written again to a new block of data, may be stored at a separate block of data, such as block 2, and recorded in the VTD table 406 with a system age of "0005," a virtual data age of "0125," and a retention threshold of "8000" based on the quality of the memory block, for example.

In another embodiment, VTD blocks 402 may be written during device initialization (i.e., before user application). During application, as data is being written to memory blocks 404, the device may read an associated VTD block 402 and use the VTD's RBER to determine a $t_{eq.app}$ to be used as data write in time for the new data being written to memory. When the device wants to check the data age of a data item, the device reads VTD and uses VTD's RBER to find $t_{eq.app}$ to be used as a present time and the data age may then be computed as the present time minus the data write in time. During a data refresh, in which the data age is compared to a data retention time threshold, the same or similar process may be used.

In other embodiments, an additional RBER add-in will occur when the device does not scan RBER at average application temperature. An average application temperature may be an average temperature for an application over time, such as 55 degrees Celsius, as computed by a temperature sensor. However, because higher temperatures may result in higher data loss and an increase in RBER, the additional RBER add-in may be computed to take this increase into account. SLC mode is used to write VTD for this reason. The additional RBER due to read temperature may be so small that it may be ignored when using SLC mode. However, when more advanced NAND is used, the additional RBER contributed by read temperature difference may be characterized using additional processes and techniques similar to those described herein.

VTD may suffer a large amount of read operations when the device frequently updates user data and checks data age. This will cause a read disturb issue in association with the VTD. Criteria may be defined for VTD refresh, such as a RBER threshold and periodically performed maintenance operation, or preparing more VTD for backup (e.g., over-provisioning).

3.4. Example Process Flow Utilizing a Virtual Timer

Figure 5:
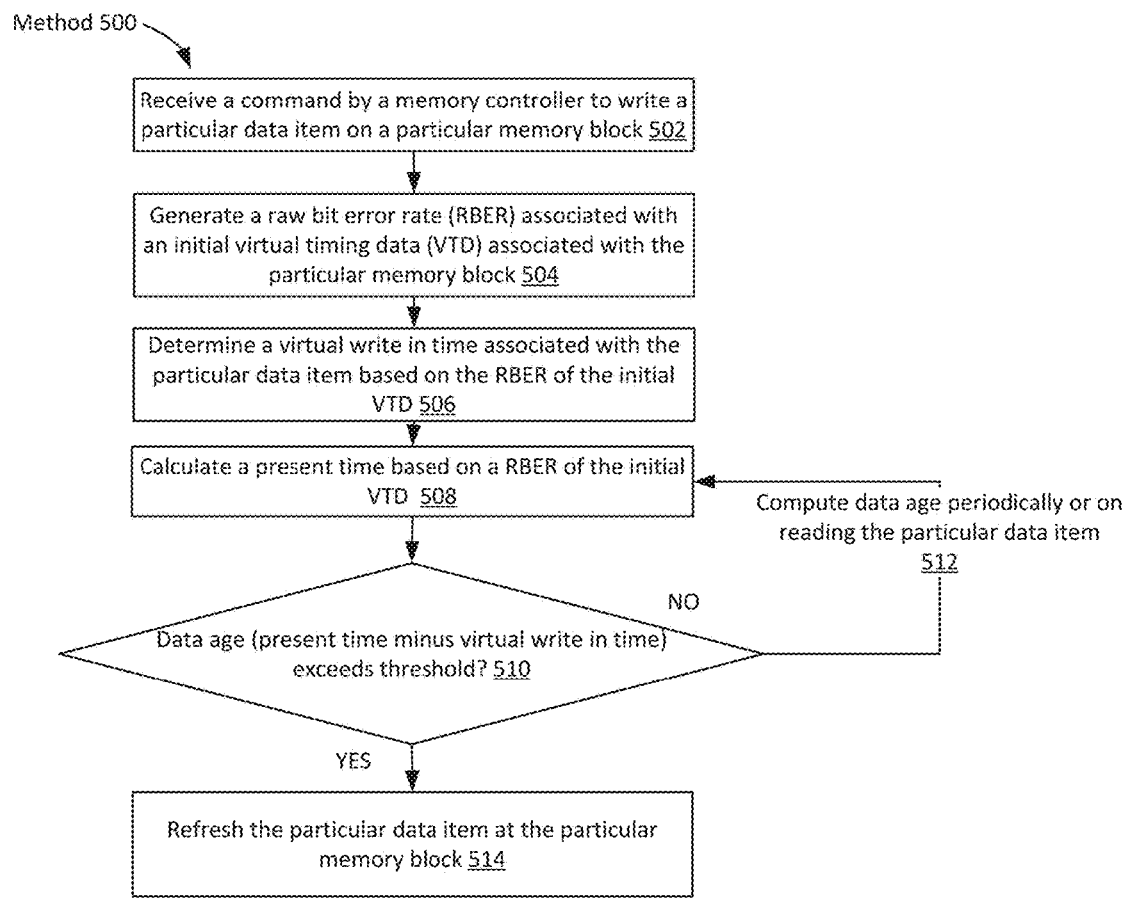
FIG. 5 is an example process flow, in accordance with one or more embodiments.

FIG. 5 illustrates an example process flow (or method) 500 for utilizing a virtual timer, in accordance with one or more embodiments. Flow 500 may be implemented, for example, in a computer system such as system 100. FIG. 5 illustrates only one possible flow for practicing the described techniques. Other embodiments may include fewer, additional, or different elements, in varying arrangements. Moreover, it will be recognized that the sequence of blocks is for convenience in explaining the process flow only, as the blocks themselves may be performed in various orders and/or concurrently.

In block 502, a memory controller, such as flash memory controller 114, in a computing device receives a command to write a particular data item on a particular memory block.

In block 504, the memory controller can generate a raw bit error rate (RBER) associated with an initial virtual timing data (VTD) associated with the particular memory block by the memory controller in a memory module, such as memory module 104.

In block 506, the memory controller can determine a virtual write in time associated with the particular data item based on the RBER of the initial VTD.

In block 508, the memory controller can calculate a present time based on a RBER of the initial VTD.

In decision block 510, the memory controller can determine whether the data age of the particular data item, which is computed as the present time minus the virtual write in time, exceeds a threshold for the particular data item. If the data age does not exceed the threshold, then the memory controller may compute 512 the data age periodically or on reading the particular data item, as described in block 508. If the data age does exceed the threshold, the memory controller can, in block 514, refresh the particular data item at the particular memory block.

4.0. Example Embodiments

Examples of some embodiments are represented, without limitation, in the following clauses:

According to an embodiment, a system comprises: a memory device; and a flash memory controller configured to write initial virtual timing data (VTD) to a particular memory block on the memory device, receive a write command associated with a particular data item, generate a raw bit error rate (RBER) associated with the initial virtual timing data on the memory device, the particular memory block storing the particular data item, and store a virtual write in time associated with the particular data item based on the generated RBER.

The system of claim 1, wherein the flash memory controller is further configured to determine a data age associated with the particular data item using a current RBER of the initial VTD as a present time, where the data age comprises the present time minus the virtual write in time.

In an embodiment, the system further comprises the flash memory controller is further configured to store the data age on a single level cell on the particular memory block. The virtual timing data may be provisioned as one or more VTD memory blocks on the memory device. The data retention threshold may be based on the memory device. The flash memory controller may be further configured to calculate the data retention threshold based on one or more characteristics of the memory device. The flash memory controller may also be configured to update the data age upon receiving a read command associated with the particular data item or may also be configured to periodically monitor the data age to determine whether the data age exceeds the data retention threshold. The flash memory controller may be configured to determine the data age after the system is in a power off mode because the virtual write in data is stored as the RBER of the initial VTD.

According to an embodiment, the system comprises the flash memory controller further configured to use a block access protocol. The memory device may include a double data rate (DDR) synchronous dynamic random-access memory (SDRAM), a flash memory, or a combination thereof. The VTD may comprise a data structure having one or more data age values associated with the particular data item, the one or more data age values mapped to a location of the particular memory block storing the particular data item on the memory device.

According to an embodiment, a memory module comprises a memory device comprising a single level cell memory block comprising virtual timing data (VTD) written during initialization, the memory device further comprising an available memory block and another available memory block and a memory controller configured to interface with the memory device, the memory controller further configured to receive a write command associated with a particular data item, generate a raw bit error rate (RB ER) associated with the VTD stored on the single level cell memory block on the memory device, determine a data age associated with the particular data item based on the RBER, store the data age on the available memory block, and responsive to determining the data age exceeds a data retention threshold, writing the particular data item at the another available memory block on the memory device.

In an embodiment, the memory module further comprises a plurality of NAND flash memory devices, each NAND flash memory device having a device endurance factor affecting the data threshold associated with the each NAND flash memory device, wherein the memory device is one of the plurality of NAND flash memory devices.

According to an embodiment, a method comprises receiving a host command from a host memory controller, the host command associated with a write transaction, generating a module command by a flash memory controller, the module command generated for the write transaction upon the flash memory controller receiving the host command, sending the module command to a memory device, generating a raw bit error rate (RBER) associated with a particular memory block on the memory device, the particular memory block storing initial virtual timing data (VTD), determining a virtual write in time associated with the particular data item based on the RBER of the initial VTD, and storing the virtual write in time on the particular memory block.

Other examples of these and other embodiments are found throughout this disclosure.

5.0. Extensions and Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A system comprising:
   a memory device; and
   a flash memory controller in communication with the memory device;
   wherein the flash memory controller is configured to write initial virtual timing data (VTD) to a particular memory block on the memory device, receive a write command associated with a particular data item, periodically generate a raw bit error rate (RBER) associated with the initial virtual timing data on the memory device, the particular memory block storing the particular data item, and store a virtual write in time associated with the particular data item based on the generated RBER;
   wherein the flash memory controller refreshes the particular data item stored in the particular memory block based at least on the RBER and the virtual write in time.

2. The system as recited in claim 1, wherein the flash memory controller is further configured to determine a data age associated with the particular data item using a current RBER of the initial VTD as a present time, where the data age comprises the present time minus the virtual write in time.

3. The system as recited in claim 2, wherein the flash memory controller is further configured to store the data age on a single level cell on the particular memory block.

4. The system as recited in claim 2, wherein the virtual timing data is provisioned as one or more VTD memory blocks on the memory device.

5. The system as recited in claim 1, wherein a data retention threshold is based on the memory device, and wherein the flash memory controller refreshes the particular data item additionally based on the data retention threshold.

6. The system as recited in claim 5, wherein the flash memory controller is further configured to calculate the data retention threshold based on one or more characteristics of the memory device.

7. The system as recited in claim 2, wherein the flash memory controller is further configured to update the data age upon receiving a read command associated with the particular data item.

8. The system as recited in claim 2, wherein the flash memory controller is further configured to periodically monitor the data age to determine the data age exceeds the data retention threshold.

9. The system as recited in claim 2, wherein the flash memory controller is further configured to determine the data age after the system is in a power-off mode.

10. The system as recited in claim 1, wherein the flash memory controller is further configured to use a block access protocol.

11. The system as recited in claim 1, wherein the memory device is a double data rate (DDR) synchronous dynamic random-access memory (SDRAM), a flash memory, or a combination thereof.

12. The system as recited in claim 1, wherein the VTD comprises a data structure having one or more data age values associated with the particular data item, the one or more data age values mapped to a location of the particular memory block storing the particular data item on the memory device.

13. A memory module comprising:
   a memory device comprising a single level cell memory block comprising virtual timing data (VTD) written during initialization, the memory device further comprising an available memory block and another available memory block; and
   a memory controller configured to interface with the memory device, the memory controller further configured to receive a write command associated with a particular data item, periodically generate a raw bit error rate (RBER) associated with the VTD stored on the single level cell memory block on the memory device, determine a data age associated with the particular data item based on the RBER, store the data age on the available memory block, and responsive to determining the data age exceeds a data retention threshold, writing the particular data item to the another available memory block on the memory device.

14. The memory module as recited in claim 13, further comprising a plurality of NAND flash memory devices, each NAND flash memory device having a device endurance factor affecting the data threshold associated with the each NAND flash memory device, wherein the memory device is one of the plurality of NAND flash memory devices.

15. A method comprising:
receiving a host command from a host memory controller, the host command associated with a write transaction;
generating a module command by a flash memory controller, the module command generated for the write transaction upon the flash memory controller receiving the host command;
sending the module command to a memory device;
periodically generating a raw bit error rate (RBER) associated with a particular memory block on the memory device, the particular memory block storing initial virtual timing data (VTD);
determining a virtual write in time associated with a particular data item based on the RBER of the initial VTD;
storing the virtual write in time on the particular memory block; and
refreshing the particular data item based at least on the RBER and the virtual write in time.

16. The method as recited in claim 15, further comprising:
determining a data age of the particular data item, the data age comprising a present time computed as current RBER of the initial VTD minus the virtual write in time;
wherein the refreshing the particular data item is in response to determining that the data age exceeds a data retention threshold.

17. The method as recited in claim 16, wherein the data age is stored on a single level cell on the particular memory block.

18. The method as recited in claim 16, wherein the virtual timing data is provisioned as one or more VTD memory blocks on the memory device.

19. The method as recited in claim 16, wherein the data retention threshold is based on the memory device.

20. The method as recited in claim 16, wherein the flash memory controller is further configured to calculate the data retention threshold based on one or more characteristics of the memory device.

21. The method as recited in claim 16, wherein the flash memory controller is further configured to update the data age upon receiving a read command associated with the particular data item.

22. The method as recited in claim 16, wherein the flash memory controller is further configured to periodically monitor the data age to determine whether the data age exceeds the data retention threshold.

* * * * *